United States Patent [19]

Kopmann

[11] Patent Number: 4,677,363
[45] Date of Patent: Jun. 30, 1987

[54] METHOD OF AND APPARATUS FOR MONITORING THE STATE OF CHARGE OF A RECHARGEABLE BATTERY

[76] Inventor: Udo Kopmann, 7, Kastanienstreet, 6246 Glashütten/Ts. 1, Fed. Rep. of Germany

[21] Appl. No.: 833,842

[22] Filed: Feb. 26, 1986

[51] Int. Cl.⁴ .................... H02J 7/04; H01M 10/44
[52] U.S. Cl. ............................ 320/44; 320/48; 320/20; 320/32
[58] Field of Search .............. 320/20, 21, 39, 40, 320/44, 45, 48, 32

[56] References Cited

U.S. PATENT DOCUMENTS

| | | | |
|---|---|---|---|
| 3,895,284 | 7/1975 | Schweizer | 320/44 X |
| 4,194,146 | 3/1980 | Patry et al. | 320/44 |
| 4,247,812 | 1/1981 | Patry et al. | 320/44 |
| 4,307,330 | 12/1981 | Belot | 320/44 |
| 4,392,101 | 7/1983 | Saar et al. | 320/20 |
| 4,503,378 | 3/1985 | Jones et al. | 320/20 |

Primary Examiner—R. J. Hickey
Attorney, Agent, or Firm—Blakely, Sokoloff, Taylor & Zafman

[57] ABSTRACT

A method of and an apparatus for monitoring the state of charge of a rechargeable battery are disclosed which use a reference value corresponding to a defined state of charge stored in a memory. During each battery charging and discharging cycle, the terminal voltage, the current and time are measured and are converted into energy delivered to the battery or by the battery depending on the direction of current flow. The actual state of charge is then calculated from the reference value stored. The characteristic terminal voltage curve during charging and discharging is used for minimizing the differences between the quantities measured and the actual state of charge of the battery so monitored by monitoring the rate of change in the terminal voltage during the charging and the discharging cycles, by determining, after a phase of a relatively steady and small rate of change in voltage, at least one point at which the rate of change in voltage is higher and by adjusting the actual state of charge determined at this point by coulometry to the predetermined reference value.

18 Claims, 3 Drawing Figures

METHOD OF AND APPARATUS FOR MONITORING THE STATE OF CHARGE OF A RECHARGEABLE BATTERY

BACKGROUND ART

This invention relates to a method of monitoring the state of charge of a rechargeable battery and, more particularly, a nickel-cadmium battery, said method comprising the storage of a reference value corresponding to a certain state of charge, the measurement of terminal voltage, current and time during each battery charging and discharging cycle and the conversion of the quantities so measured into quantities corresponding to the energy charged or discharged, accounting for the direction of current flow. In addition, the invention relates to an apparatus for carrying out said method. The term "rechargeable battery" as used herin refers to monocells as well as any combination comprising a plurality of cells.

Rechargeable batteries have become increasingly important mainly to supply emergency power to computing facilities, to control systems for machinery and equipment and to medical apparatuses, to supply electricity to measuring, signalling and alarm devices and to provide power for traction or to start agricultural machinery as well as aeronautical equipment and equipment for space travel. Continuous monitoring of the state of charge of such batteries by means which are as accurate as possible is necessary for users in many applications to avoid a stoppage or an interruption of the operation of the equipment served by such batteries, such as a computer or a measurement or control or alarm system. Existing battery cell capacities can only be fully utilized and charging or discharging beyond certain limits, having detrimental effects upon batteries, can only be avoided by state-of-charge monitoring.

Devices for monitoring the state of charge of nickel-cadmium batteries heretofore known usually employ one of two different methods.

According to the more simple one of said two methods, cell terminal voltage is measured, an upper voltage limit defining the end of the cell charging cycle and a lower voltage limit defining the end of the cell discharging cycle. The accuracy of the use of terminal voltage as a measure of the electrochemical cell conditions may be improved by correcting the terminal voltage so measured as a function of the charging or discharging currents and cell temperature measured together with said terminal voltage.

It is an innate defect of the above method that the application of said method will only provide a signal indicating that the battery is fully charged, the charging current must be switched off and full charge must now be maintained by appropriate means as well as a signal indicating that the battery is empty and the load must be switched off.

The second method heretofore known employs the coulometry principle. Said method calls for the measurement of the energy delivered by the battery being in a predetermined initial state of charge which is normally the fully charged condition. According to said method, signals corresponding to the quantity of energy delivered to or by the battery are transmitted to a counter or a reference cell and a signal representing the remaining battery charge available for delivery is obtained from the difference between the design cell capacity and the energy delivered by the battery.

As in the case of the first method referred to hereinabove, the remaining charge so obtained may be corrected as a function of current, cell temperature and charging efficiency for indication.

Devices are even known which measure the number of battery charging and discharging cycles and battery life to predict the effect of battery ageing or spontaneous cell discharging on the design capacity of the battery.

It is a well-known disadvantage of the second method described that the state of charge determined by continuous ampere-hour measurement may, in the case of batteries operated in continuous cycles, differ from the actual state of charge, because real battery behavior and hence actual cell capacity cannot be predicted sufficiently accurately in spite of corrections made as a function of different quantities that may be measured. The coulometry method disclosed by the West German patent application No. 30 12 356 therefore proposes the elimination of this source of error by manual resetting after each completed charging cycle to compare the state of charge predicted from the measured energy input and output and the actual state of charge.

SUMMARY OF THE INVENTION

It is an object of the present invention to minimize, in the case of coulometric monitoring of the state of charge of a rechargeable battery, the difference between the predicted and the actual state of charge of the battery monitored and to provide for an automatic adjustment of the state of charge determined by changes in the real battery behavior.

With said object in view, the present invention exploits the identifiability of points on the characteristic charging terminal voltage curve and the characteristic discharging terminal voltage curve during the charging cycle and the discharging cycle respectively, said points allowing certain conclusions to be drawn with respect to both the actual state of charge of the battery or cell and the remaining energy available for delivery. Said points on said characteristic terminal voltage curves are defined as follows:

During Charging $A_1$ Commencement of acceleration of voltage increase (progressive rate of voltage change), following a phase of constant low voltage increase per unit time (plateau voltage)

$A_2$ Point of inflection of voltage increase $A_3$ Passage of defined maximum voltage limit or peak voltage

During Discharging $E_1$ Commencement of acceleration of voltage decrease (progressive rate of voltage change), following a phase of constant low voltage decrease per unit time (plateau voltage)

$E_2$ Passage of defined minimum voltage limit

Exploiting the above insight, the object of the present invention is achieved for the described coulometric method by monitoring the rate of terminal voltage change during the charging and discharging cycles, by determining at least one point, following a phase of relatively constant and low rate of voltage change, at which point a characteristic higher rate of voltage change occurs and by adjusting the computed actual state of charge at said point, or at a point delayed by a defined margin, to a predetermined reference value.

The differences between the energies stored at said points (hereinafter referred to as "adjustment points") are, assuming continuous charging and discharging at constant current and temperature conditions, in a certain relationship with battery capacity subject to definable tolerances. It is realized that the difference between the energy stored at the maximum voltage limit and the energy stored at the minimum voltage limit, said two limits defining the fully charged condition and the fully discharged condition respectively, is a more accurate measure of battery capacity than the differences between $A_1$ and $E_1$ or $A_2$ and $E_1$, said points having been defined above, but the terminal voltage passes said points $A_1$, $A_2$ and $E_1$ during normal battery operation comprising incomplete charging and discharging cycles more frequently than said voltage limits, thereby allowing a more frequent adjustment in accordance with the present invention and thereby a more frequent calibration by reference to a characteristic reference value, thus improving the accuracy in the determination of the battery state of charge. The continual automatic adjustment thereby achieved also optimizes the evaluation of the actual electro-chemical condition of the cell(s) so monitored.

The automatic correction of the determination of the state of charge and the state of discharge by computation (coulometry) made according to one of the aspects of the present invention as the real charging and discharging cycles proceed allow the application of the present invention for monitoring and indicating the state of various other electrochemical cycles which may not be predicted accurately or the status of which may only be determined during infrequent phases of a closed-loop process by the measurement of reference quantities.

The identification of the adjustment points may not only be used for the determination of the total actual capacity of at least one battery. Said points also correspond to defined states of charge. Each such reference state of charge is compared with the state of charge determined by coulometry for the corresponding point and any difference between said reference state of charge and said state of charge so determined exceeding a tolerance normally specified separately for each such adjustment point automatically causes an adjustment of the state of charge determined for the point for which such difference was registered and a corresponding updating of the residual capacity display for the coulometric measure- ment.

According to another aspect of the present invention, the actual states of charge are determined at the adjustment points of the charging and the discharging cycles and the difference between the energies stored at two such points is used as a measure of battery capacity. The difference between the energy stored at point $E_1$ at which the progressive rate of decrease in terminal voltage commences during the discharging cycle and point $A_1$ is, for example, equivalent to approximately 70% of the battery capacity. Exploiting this aspect of the present invention, the capacity of an unknown cell configuration may be determined or predicted by extrapolation with one calibration cycle comprising one charging cycle and one discharging cycle and the passage of at least two adjustment points from the difference between the energies stored at two such points.

The conditions required for attributing specific states of charge to adjustment points and for a simple automatic adjustment represented by constant current and temperature conditions during charging and discharging cycles are rarely given in a real environment. It is also important to monitor the state of charge under varying load and temperature conditions. Therefore, according to yet another aspect of the present invention, temperature and current and internal battery resistance may be measured and the quantities so measured are used for correction in the determination of the state of charge. Using a stored computer program, the voltage measured continuously or the energy charged or discharged may be normalized as a function of the quantities so measured, thereby allowing the correct automatic identification of the adjustment points and eliminating the error of identifying, for example, a voltage drop due to a change in current or switching as such an adjustment point of the discharging cycle.

According to yet another aspect of the present invention, under highly variable discharge conditions, the misidentification of a variation in load as one of the adjustment points may be avoided relatively easily by monitoring the terminal voltage and by adjusting the state of charge determined by coulometry to the reference value predetermined for the appropriate adjustment point only if the voltage passes, during the discharge cycle, below a predetermined limit voltage thereby only identifying a point as an adjustment point if discharge has proceeded to a given relatively low state of charge. It is also possible to compensate for changes in battery voltage behavior by computing means as a function of changes in simultaneously measured discharge current, the shift in the characteristic voltage curve associated with charge current variations being adjusted to a predetermined (normalized) voltage- versus-time curve. Further, changes in battery voltage behavior may be compensated for by accounting for battery or cell temperature, thereby substantially eliminating the influence of temperature on the determination of the adjustment points and on the determination of the state of charge. Temperature compensation is further possible as a function of temperature change over time, computing (a) derivative(s), the program of the appropriate computing means not being made more complex, as derivatives are needed for the determination of rates of voltage change.

Quantities measured for carrying out the method proposed by the present invention are picked up at a predetermined and preferably variable scanning frequency, processed and stored at regular intervals, said latter storage operations being particularly vital as regards the voltages obtained by coulometry. The quotient of the differential of each two consecutive voltages so stored over time is calculated and if the differential quotient so calculated exceeds a value computed as a function of current, direction of current flow, temperature and state of charge determined by coulometry, the time intervals at which the voltages measured are stored are shortened by a factor also computed as a function of current and temperature. During such intervals of higher scanning rates, the differential quotients determined for the two to four preceding coltage scans are stored in addition to the voltages measured, thereby allowing the approximation of higher-order derivatives for determining positive or negative variations in the rate of voltage change. If computation at relatively high scanning frequency shows that no adjustment point has been reached, then the scanning frequency may be decreased to the base scanning frequency.

The coulometric determination of the energy stored and delivered by the battery may be supported by coupling a reference capacity device (memoriode) having a substantially linear voltage-versus-charge characteristic across the battery monitored, said device allowing an integration of current and time which is independent of the scanning cycle frequency.

BRIEF DESCRIPTION OF THE DRAWINGS

The present invention is illustrated by the accompanying drawings in which.

DETAILED DESCRIPTION OF THE INVENTION

Figure 1:
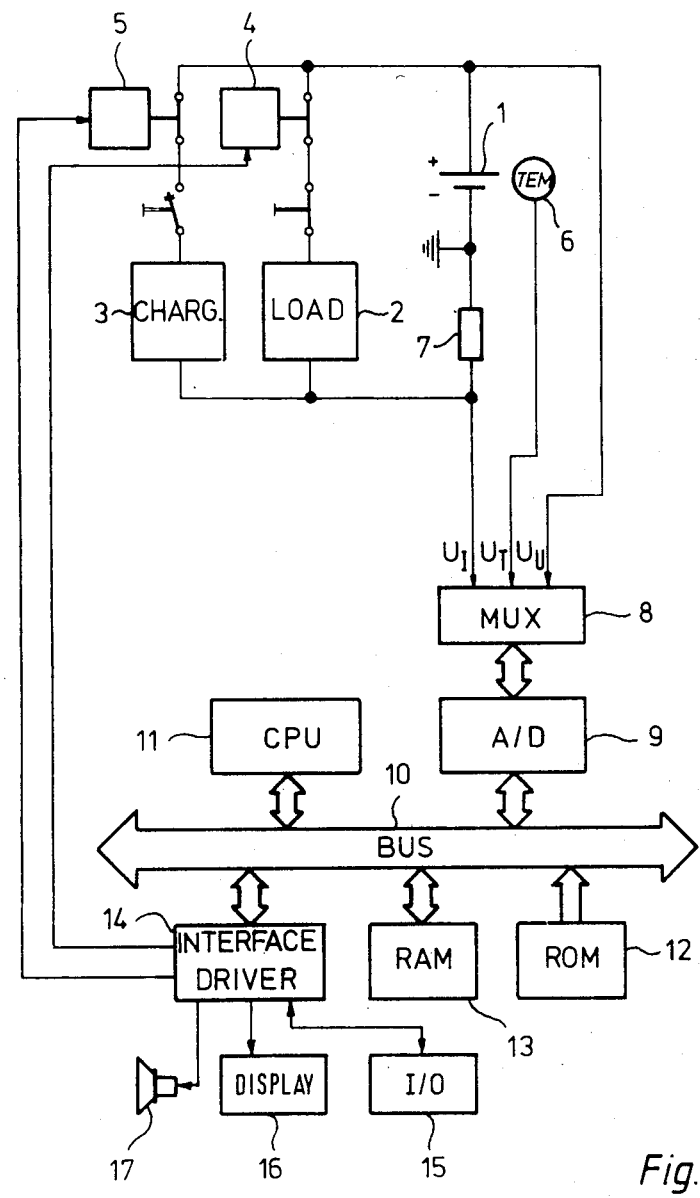
FIG. 1 is a block diagram of an embodiment of an apparatus for monitoring battery state of charge with a load connected to the battery so monitored (discharging cycle)

The arrangement depicted in FIG. 1 shows a battery 1, which is a nickel-cadmium cell in the preferred embodiment of the present invention, said battery 1 supplying electricity to a load 2 during the depicted discharging cycle and being capable of being charged by a charger 3. Manual switches and contacts actuated automatically by actuators as, for example, relays or switching transistors 4,5 are provided for making and breaking the charging and discharging circuits of battery 1.

In the embodiment of the present invention here described, the apparatus for monitoring the battery state of charge processes three quantities which comprise potential $U_U$ proportional to the terminal voltage of battery 1, potential $U_T$ proportional to the cell temperature picked up by a temperature detector 6 and potential $U_I$ proportional to the amperage and the direction of flow of the current flowing in the charging and discharging circuits of battery 1. The latter potential is picked up by a high-precision resistor 7 with respect to chassis connected with the negative pole of battery 1. Said three analog potentials $U_I$, $U_T$ and $U_U$ which may be amplified by a multiplexer 8 are transmitted across an analog-to-digital converter 9 digitizing analog quantities and through bus 10 to a program-controlled central processing unit 11. Said central-processing unit is preferably part of a microprocessor unit and its program is stored in a read-only memory (ROM) 12 which may be programmable. A random-access memory 13 is used as main memory. Both memories 12 and 13 are connected to the central-processing unit 11 by bus 10.

A peripheral interface driving circuit 14 connects central-processing unit 11 with all peripheral devices. In the depicted embodiment of the present invention, said peripheral devices comprise an input/output unit (I/O) 15, a visual indicating device, as for example, an optical alarm or a visual display unit 16, an acoustic indicating device 17 and actuating means 4 and 5 for interrupting the battery charging and discharging circuits.

Figure 2:
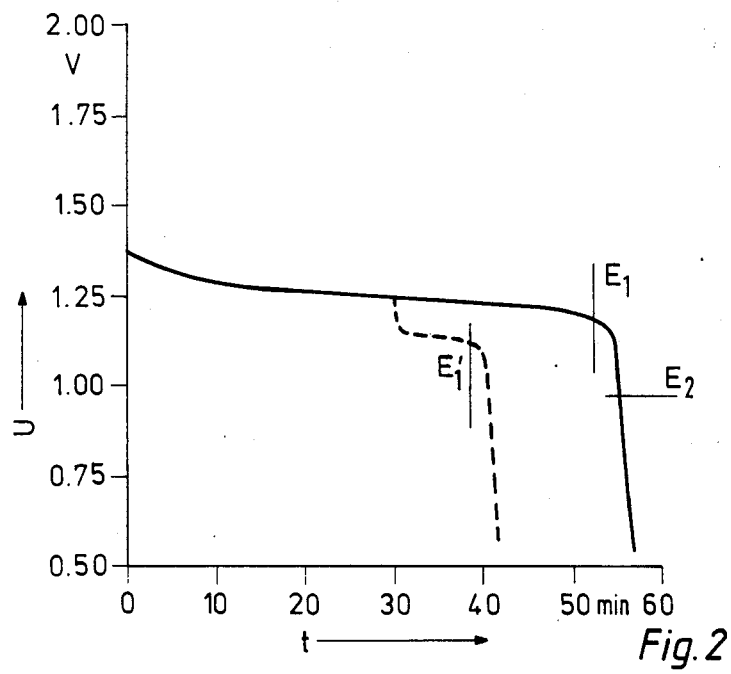
FIG. 2 is a voltage-versus-time curve during the discharging cycle for a nickel-cadmium battery.
Figure 3:
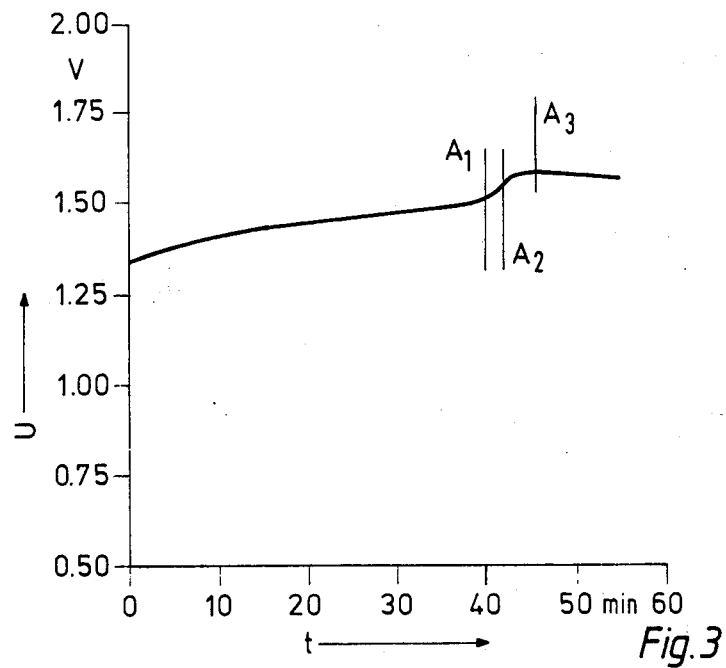
FIG. 3 is a characteristic voltage-versus-time curve during the charging cycle.

The functioning of the arrangement depicted in FIG. 1 is in the following described for the typical characteristic terminal voltage curves for the discharging and charging cycles as shown in FIG. 2 and 3 respectively. Upon the commencement of the discharging cycle, the nominal capacity of battery 1 is stored in the read-only memory 12 and/or the random-access memory 13 depending on the application. The energy discharged from battery 1 is obtained from $U_I$ and $U_U$ and time derived from the clock generator of central-processing unit 11, updated in the random-access memory 13 and converted, by the central-processing unit by comparison with the nominal or full charge, into a residual charge which may, for example, be indicated by the visual indicating device 16. As demonstrated by FIG. 2, the terminal voltage $U_U$ remains almost constant until approximately 80 to 85% of the energy has been discharged, reducing the residual charge to approximately 20 to 15% (plateau voltage). The rate of change in the terminal voltage $U_U$ thereupon increases, said increase in said rate of change being identified as point $E_1$ by the central-processing unit 11. Said identification is made by central-processing unit 11 by differentiation or an approximation of the differentiation of the characteristic voltage-versus-time curve and higher-order derivatives and higher scanning cycle frequencies in conjunction with a higher digitizing frequency of the analog-to-digital converter 9 may be employed for higher accuracy. The residual charge available at said adjustment point $E_1$ during each discharging cycle may be predicted relatively accurately (predetermined reference value). The state of charge determined continuously by coulometry is compared with said reference value and if the difference between said reference value and the state of charge determined by coulometry exceeds a certain limit, the state of charge determined by coulometry is adjusted to said reference value. The identification of point $E_1$ is also a reliable indicator showing that the residual charge has not yet dropped to the minimum voltage for the discharging cycle designated by point $E_2$ on the characteristic curve depicted in FIG. 2.

If the load is thereupon isolated from battery 1 and the charger 3 is connected to battery 1 for example by the manual actuation of the switch means provided in the charging circuit, the central-processing unit 11 identifies the commencement of the charging cycle by the reversal of the sign of the current proportional potential $U_I$. The energy so charged is measured by coulometry and stored by central-processing unit 11 and by random-access memory 13 by a method substantially the same as the method used during the discharging cycle. The rate of voltage change is again almost constant for a relatively long period of time until the point of a progressive increase in the rate of voltage change designated by $A_1$ in FIG. 3 is reached. At said point $A_1$, the cell charge is equivalent to approximately 85 to 90% of the cell capacity. Substantially as for point $E_1$, point $A_1$ is identified by the determination of the rate of change in terminal voltage which changes at said point $A_1$ noticeably relative to the rate of change during the preceding plateau voltage phase. During the preceding discharging cycle, the state of charge determined by coulometry for point $E_1$ was adjusted to a reference value which represents a (more accurate) measure of the actual residual charge and thence the state of charge of battery 1. The residual charge at point $E_1$ and the energy charged, as measured during the preceding partial charging cycle, to point $A_1$ add up to the actual state of charge of battery 1 and even allow a calibration of the monitoring apparatus to account for the condition of monitored battery 1. Using said data accessible to central-processing unit 11, the new state of charge determined by coulometry may again be adjusted to the reference value for point $A_1$ and stored in random-access memory 13. If charging is continued when point $A_1$ has been reached, a point of inflection $A_2$ of the voltage-versus-time curve and the maximum or peak voltage limit at approximately point $A_3$ represent further characteristic points of said voltage-versus-time curve. Points $A_1$, $A_2$ and $A_3$ may all be identified by first or higher-order derivatives of the curve of terminal voltage $U_U$ depicted in FIG. 3. Each time point $E_1$ and $A_1$ or $A_2$ are passed, the state of charge determined by coulometry is again adjusted to the reference value if the difference between the state of charge determined by coulometry and the reference value for said point exceeds a given limit, whereupon coulometry is continued using the last adjustment made to said reference value.

The identification of predetermined points $E_1$ and $A_1$ and $A_2$ allows the reliable interruption of discharging or charging circuits by the monitoring apparatus prior to passing minimum or maximum voltage limits, thereby warranting long life of the battery or battery pack so monitored.

Load changes of the nature depicted in FIG. 2 by a broken voltage line may be identified by continuous current measurement. As no such load change affects the general behavior of the terminal voltage $U_U$, a new point $E'_1$ will be reached at the end of a plateau voltage phase under the new load conditions. The program of read-only memory 12 may feature a normalized characteristic curve to which the new characteristic voltage-versus-time curve attributable to the influence of load or temperature is referred and an adjustment as a function of the changed current and temperature data.

Thus, a method of and apparatus for monitoring the state of charge of a rechargeable battery have been described. Although such method and apparatus have been described with reference to a particular and preferred embodiment, it will be appreciated by those skilled in the art that various modifications may be made to such disclosed embodiment without departing from the spirit and scope of the following claims.

I claim:

1. A method of monitoring the state of charge chargeable battery and, more particularly, a nickel-cadmium storage battery comprising the storage of a reference value corresponding to a certain state of charge, the measurement of the terminal voltage, the current and time during each battery charging and discharging cycle and the conversion of the quantities so measured into a quantity corresponding to the energy charged or discharged, accounting for the direction of current flow, said quantity being used for computing the actual state of charge based on said reference value, characterized in that the rate of change in said terminal voltage is monitored during said charging and discharging cycles and in that at least one point, following a phase of relatively steady and low rate of change in said terminal voltage, is determined, at which point a characteristic higher rate of change in said terminal voltage occurs and in that the computed actual state of charge at said point or at another point delayed with respect to said point by a predetermined margin is adjusted to said predetermined reference value.

2. A method of monitoring the state of charge of a rechargeable battery having terminals for providing a terminal voltage during charge and discharge cycles, said terminal voltage subjected to a relatively steady and low rate of charge during a substantial phase of said charge and discharge cycles and to a characteristic higher rate of charge outside said substantial phase, said method comprising the steps of:

(a) providing a reference value representative of a certain state of charge of said battery and storing said reference value in a storage means;

(b) measuring the terminal voltage, the current flow through the battery and the time, during each battery charge and discharge cycle;

(c) converting said measured quantities into a further quantity, said further quantity corresponding in response to the direction of current flow to the energy charged or discharged;

(d) computing in response to said further quantity and actual state of charge based on said stored reference value;

(e) monitoring the rate of change in said terminal voltage during each of said charge and discharge cycles and determining at least one point following said phase of relatively steady and low rate of change in said terminal voltage at which point a characteristic higher rate of change in said terminal voltage occurs; and (f) adjusting the computed actual state of charge at one of said points and of any other point delayed with respect to said one point by a predetermined margin to said stored reference value.

3. A method according to claim 1 wherein the actual states of charge are determined at a first such adjustment point in the charging cycle and at a second such adjustment point in the discharging cycle and in that the difference between the energies stored at said two points is used to determine the capacity of the battery.

4. A method according to claim 1 wherein said point at which a characteristic rate of change in voltage occurs represents a point at which a progressive change in voltage commences.

5. A method according to claim 1 wherein said point at which said characteristic rate of change in voltage occurs represents a point of inflection in the curve plotting the increase in voltage during a charging cycle.

6. A method according to claim 1 wherein said terminal voltage is monitored and in that the state of charge determined by coulometry at each adjustment point is only adjusted to said predetermined reference value for said adjustment point if a certain limit voltage is exceeded during a charging or a discharging cycle.

7. A method according to claim 1 characterized in that the battery temperature is also measured and in that the temperature so measured is accounted for in the identification of said adjustment points and in the computation of the states of charge.

8. A method according to claim 1 wherein changes in the voltage-versus-time behavior of any such battery are compensated for by computing means in response to changes in the charge or discharge current.

9. A method according to claim 1 wherein changes in the voltage-versus-time behavior of any such battery are compensated for in response to the battery temperature.

10. A method according to claim 1 wherein said quantities are measured and processed at a predetermined scanning frequency which may be varied and wherein said scanning frequency is increased close to said adjustment points to improve the accuracy of measurement.

11. A method according to claim 1 wherein the rate of change in terminal voltage is determined by computing voltage over time derivatives and wherein, by way of the intermediate storage of derivatives, higher order derivatives are obtained for identifying said adjustment points.

12. A method of monitoring the state of charge of a rechargeable battery having terminals for providing a terminal voltage during charge and discharge cycles, said terminal voltage subjected to a relatively steady and low rate of charge during a substantial phase of said charge and discharge cycles and to a characteristic higher rate of charge outside said substantial phase, said method comprising the steps of:
   (a) providing a reference value representative of a certain state of charge of said battery and storing said reference value in a storage means;
   (b) measuring the terminal voltage, the battery temperature, the current flow through the battery and the time, during each battery charge and discharge cycle;
   (c) converting said measured quantities into a further quantity, said further quantity corresponding in response to the direction of current flow to the energy charged or discharged;
   (d) computing in response to said further quantity an actual state of charge based on said stored reference value;
   (e) monitoring the rate of change in said terminal voltage and battery temperature during each of said charge and discharge cycles and determining at least one point in which the temperature so measured is accounted for, said at least one point following said phase of relatively steady and low rate of change in said terminal voltage at which point a characteristic higher rate of change in said terminal voltage commences; and
   (f) adjusting the computed actual state of charge at said at least one point and of any other point delayed with respect to said at least one point by a predetermined margin to said stored reference value, wherein changes in the voltage-versus-time behavior of such battery are compensated for by computing means in response to changes in the charge of discharge current and in response to the battey temperature.

13. An apparatus for monitoring the state of charge of a rechargeable battery having terminals for providing a terminal voltage during charge and discharge cycles, said terminal voltage subjected to a relatively steady and low rate of charge during a substantial phase of said charge and discharge cycles and to a characteristic higher rate of charge outside said substantial phase, said apparatus comprising,
   means for measuring the terminal voltage of the battery, the direction and the amplitude of the charging and discharging currents and the battery temperature,
   a program-controlled central processing unit coupled to said measuring means and controlled to monitor the rate of change in the terminal voltage during all charging and discharging cycles of said battery and to determine an actual state of charge when, following a substantially constant phase, said rate of change undergoes one of a substantial increase and substantial decrease,
   memory means coupled to said central processing unit for storing reference values and the actual energy input and energy output values computed by said central processing unit, and
   an interface and driving circuit for coupling said central processing unit with peripheral input and output units.

14. An apparatus according to claim 13 wherein said measuring means are coupled to said central processing unit by way of multiplexing means, an analog-to-digital converter and a bus.

15. An apparatus according to claim 14 wherein the scanning frequency of said analog-to-digital converter may be controlled by said central processing unit.

16. An apparatus according to claim 13, wherein said measuring means comprises means for measuring current having a resistor included in the current circuit of the battery and maintained at a predetermined potential at one end which is coupled to said battery.

17. An apparatus according to claim 13 wherein a program storage means for controlling said central processing unit is provided, said program storage means containing a program for correcting the actual state of charge determined and the adjustment points in response to changes in temperature and current.

18. An apparatus according to claim 13 wherein said interface and driving circuit is provided with actuating and switch means for interrupting the battery charge and discharge circuits if predetermined limits for the terminal voltage are exeeded.

* * * * *

UNITED STATES PATENT AND TRADEMARK OFFICE
CERTIFICATE OF CORRECTION

PATENT NO. : 4,677,363

DATED : June 30, 1987

INVENTOR(S) : Kopmann

It is certified that error appears in the above-identified patent and that said Letters Patent is hereby corrected as shown below:

Please insert the following information regarding the PCT application and foreign application priority data on the patent cover page:

| COLUMN | DESCRIPTION |
|---|---|
| (22) | --PCT Filed: July 1, 1985--. |
| (86) | --PCT No.: PCT/EP85/00317<br>Section 371 Date: Feb. 26, 1986<br>Section 102(e) Date: Feb. 26, 1986-- |
| (87) | --PCT Pub. No.: WO86/00418<br>PCT Pub. Date: Jan. 16, 1986-- |
| (30) | --Foreign Application Priority Data<br>Jun. 30, 1984 (FRG) Fed. Rep. of Germany...34 24 191 -- |

Signed and Sealed this

Nineteenth Day of July, 1988

Attest:

DONALD J. QUIGG

*Attesting Officer*    *Commissioner of Patents and Trademarks*